United States Patent [19]
Kawakami et al.

[11] Patent Number: 5,276,725
[45] Date of Patent: Jan. 4, 1994

[54] EXPOSURE SYSTEM

[75] Inventors: Eigo Kawakami, Ebina; Minoru Yoshii; Shunichi Uzawa, both of Tokyo, all of Japan

[73] Assignee: Canon Kabushiki Kaisha, Tokyo, Japan

[21] Appl. No.: 996,508

[22] Filed: Dec. 14, 1992

Related U.S. Application Data

[63] Continuation of Ser. No. 723,672, Jun. 27, 1991, abandoned, which is a continuation of Ser. No. 349,775, May 10, 1989, abandoned.

[30] Foreign Application Priority Data

May 10, 1988 [JP] Japan .................. 63-111457

[51] Int. Cl.$^5$ .................................. G21K 5/00
[52] U.S. Cl. ........................... 378/34; 378/205
[58] Field of Search ................ 378/34, 35, 206

[56] References Cited

U.S. PATENT DOCUMENTS

| | | | |
|---|---|---|---|
| 4,513,203 | 4/1985 | Bohlen et al. | 378/34 |
| 4,524,280 | 6/1985 | Ishikawa | 250/548 |
| 4,703,166 | 10/1987 | Bruning | 250/201 |
| 4,724,466 | 2/1988 | Ogawa et al. | 355/53 |
| 4,777,641 | 10/1988 | Inagaki et al. | 378/34 |
| 4,803,713 | 2/1989 | Fujii | 378/34 |
| 4,856,037 | 8/1989 | Mueller et al. | 378/34 |

FOREIGN PATENT DOCUMENTS

| | | |
|---|---|---|
| 2274073 | 1/1976 | France . |
| 60-55624 | 3/1985 | Japan .................. 378/34 |
| 1501908 | 2/1978 | United Kingdom . |

OTHER PUBLICATIONS

Betz, H., et al., "Resolution limits in x-ray lithography calculated by means of x-ray lithography simulator XMAS", Journal of Vacuum Science and Technology, Jan.-Feb. 1986, vol. 4, No. 1, pp. 248-252.

Primary Examiner—Craig E. Church
Attorney, Agent, or Firm—Fitzpatrick, Cella, Harper & Scinto

[57] ABSTRACT

An exposure apparatus usable with a mask having a pattern and a wafer having a radiation-sensitive surface layer, for transferring with a radiation energy beam the pattern of the mask to the wafer, is disclosed. The apparatus includes a mask supporting member for supporting the mask; a wafer supporting member for supporting the wafer; a reflective member having a reflection surface and an indication pattern, the reflective member being supported by one of the mask supporting member and the wafer supporting member; an arrangement for projecting a beam, which is thinner than the radiation energy beam and which advances along or about the axis of the radiation energy beam, upon the reflective member; a device for observing a positional relationship between the indication pattern and a spot formed by projection of the thinner beam upon the reflective member; and a device for correcting a relationship between the indication pattern and the spot, on the basis of the observation.

30 Claims, 3 Drawing Sheets

FIG. I

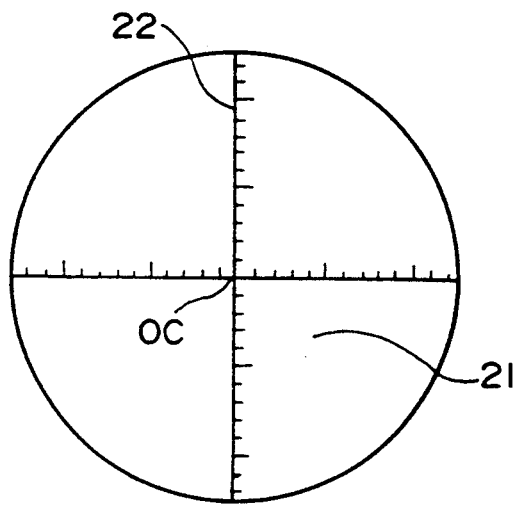
F I G. 2
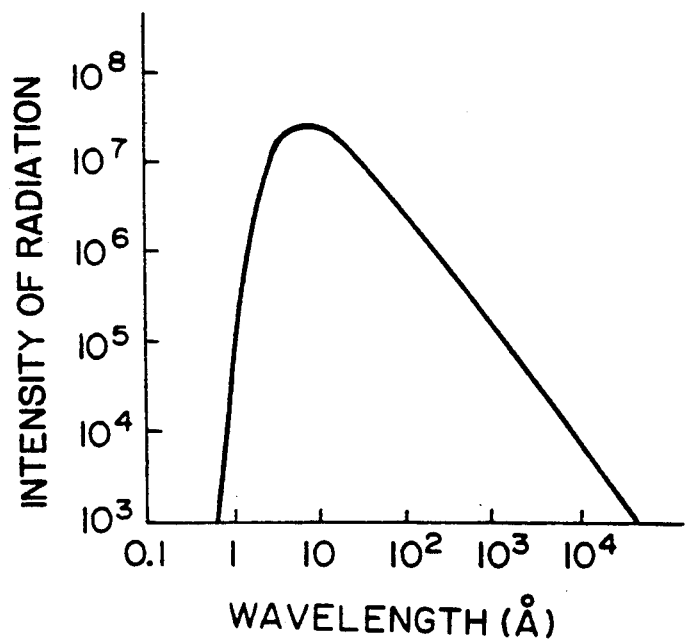
F I G. 3

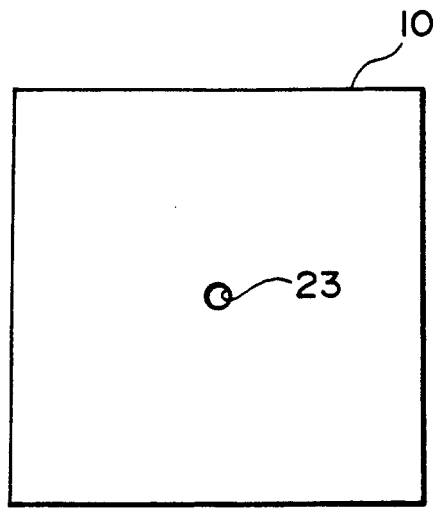
F I G. 4
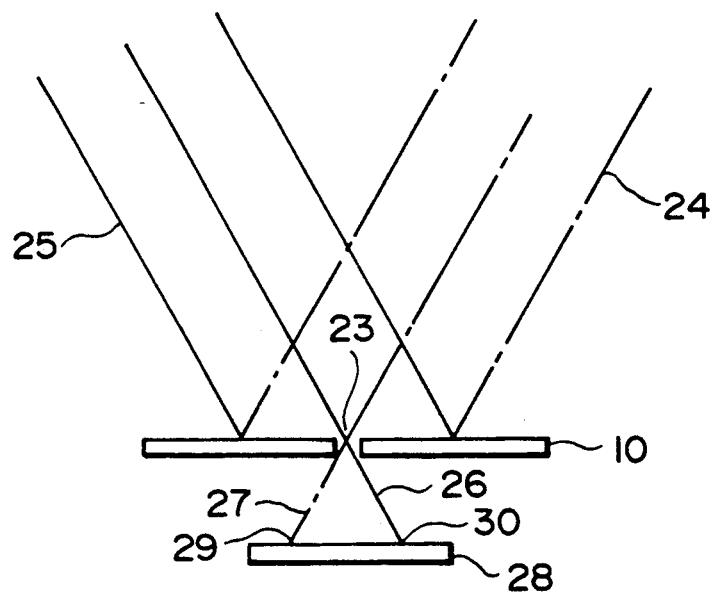
F I G. 5

EXPOSURE SYSTEM

This application is a continuation of application Ser. No. 07/723,672 filed Jun. 27, 1991, now abandoned, which is a continuation of application Ser. No. 07/349,775 filed May 10, 1989, now abandoned.

FIELD OF THE INVENTION AND RELATED ART

This invention relates to an exposure system for transferring onto a workpiece a pattern formed on an original. More particularly, the invention is concerned with an exposure system which uses a synchrotron orbital radiation (SOR) beam as an exposure energy and which is arranged to execute axis alignment between the exposure beam and a pattern transferring exposure station of the exposure system.

In the field of the manufacture of semiconductor microcircuit devices such as integrated circuits (ICs), large scaled integrated circuits (LSIs) and the like, many proposals have been made to an exposure system using X-rays of a wavelength of an order of 1–150 angstroms, for example, in an attempt to meet the requirement of higher-resolution printing with further increase in the density of semiconductor devices. Among these X-ray exposure systems, those which use a synchrotron orbital radiation beam having high luminance are considered effective. In such an exposure system, a mask and a wafer are disposed opposed to each other and in parallel to each other with a predetermined gap (clearance) maintained therebetween. A synchrotron orbital radiation beam is projected perpendicularly to the mask and the wafer, within a predetermined exposure area, by which a pattern formed on the mask is transferred onto the wafer having a suitable radiation-sensitive surface layer. Since, however, the structure of a light source device for providing the synchrotron orbital radiation beam is very bulky as compared with a simple light source device used in traditional exposure systems, it is difficult to provide a major assembly of an exposure system, including a pattern transferring exposure station, as a unit with such a synchrotron orbital radiation source device. In consideration of this difficulty, the major assembly of the exposure system has to be separated from the radiation source device. This results in the possibility of a change in the relative attitude of the radiation source device and the major assembly of the exposure system, which causes an undesirable change in the angle of incidence of the exposure beam upon the pattern transferring exposure station. If this occurs, the pattern of the mask can not be transferred correctly and accurately.

Where a reflection mirror is used to set the angle of radiation of a synchrotron orbital radiation beam, if the set angle of such reflection mirror is not correct, the radiation beam flux can not impinge on a mask or wafer exactly perpendicularly or, in some cases, the position of incidence of the radiation beam flux deviates.

SUMMARY OF THE INVENTION

In consideration of the foregoing, the present invention aims at solving problems involved in the axis alignment between a pattern transferring exposure station of an exposure system and an exposure beam such as a synchrotron orbital radiation beam, to thereby allow the exposure beam to be projected perpendicularly upon an original or a workpiece, placed in the pattern transferring exposure station within a predetermined positional relationship and to execute higher-precision printing with less pattern transfer distortion.

In another aspect, the invention aims at accomplishing the axis alignment with an inexpensive structure.

Briefly, in accordance with an aspect of the present invention, there is provided an exposure system using a synchrotron orbital radiation beam, supplied from a radiation source, and including a pattern transferring exposure station effective to transfer, by exposure, a pattern formed on an original, such as a mask, onto a workpiece, such as a semiconductor wafer, wherein light in a visible region or a region adjacent thereto, which is contained in the synchrotron orbital radiation beam supplied from the radiation source, is used to accomplish axis alignment between the radiation source and the pattern transferring exposure station. This allows axis alignment without the necessity of an X-ray detector which is expensive.

In one preferred form of the present invention, the exposure apparatus usable with a mask having a pattern and a wafer having a radiation-sensitive surface layer, for transferring with a radiation energy beam the pattern of the mask to the wafer, comprises:

a mask supporting member for supporting the mask;
a wafer supporting member for supporting the wafer;
a reflective member having a reflection surface and an indication pattern, said reflective member being supported by one of said mask supporting member and said wafer supporting member;
means for projecting a beam, which is thinner than the radiation energy beam and which advances along or about the axis of the radiation energy beam, upon said reflective member;
means for observing a positional relationship between the indication pattern and a spot formed by projection of the thinner beam upon said reflective member; and
means for correcting a relationship between the indication pattern and the spot, on the basis of the observation.

In another preferred form, the exposure apparatus further comprises:

a projector having an axis which is coaxial with or substantially coaxial with the axis of the radiation energy beam, said projector having a masking member which can be projected upon said reflective member supported by one of said mask supporting member and said wafer supporting member;
an optical system effective to re-image the masking member projected upon said reflective member, said re-imaging optical system having an axis which is coaxial with the axis of the radiation energy beam; and
means for correcting any inclination of said reflective member to bring the position of the image as formed as a result of the re-imaging into a predetermined relationship with respect to the axis of said re-imaging optical system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic view, illustrating a view field of an autocollimator used in the FIG. 1 embodiment.

FIG. 3 is a graph representing a distribution of intensity of radiation with respect to wavelength.

FIG. 4 is an enlarged view showing a radiation blocking member usable in the present invention.

FIG. 5 is a schematic view, representing the function of the radiation blocking member.

DESCRIPTION OF THE PREFERRED EMBODIMENTS

Figure 1:
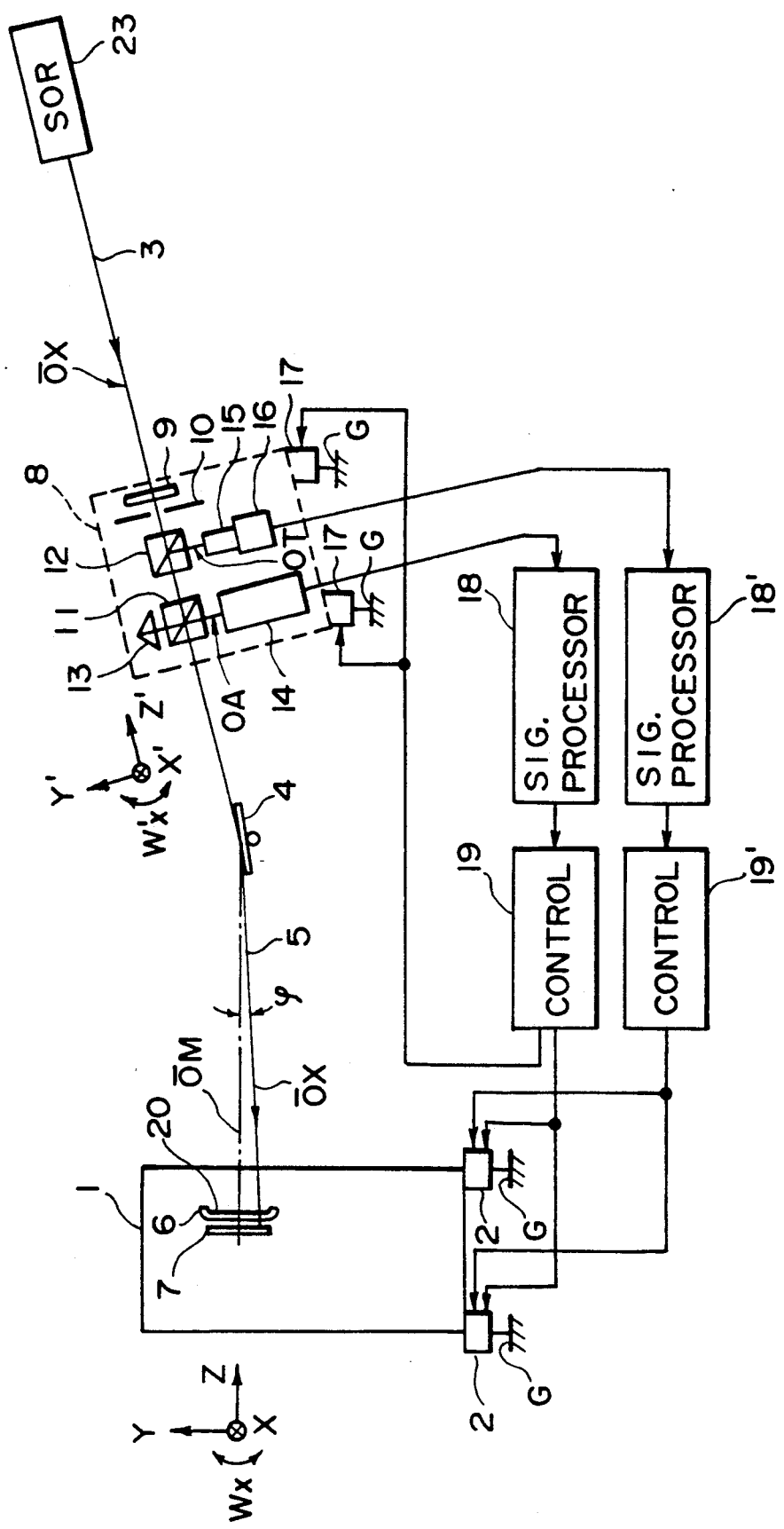
FIG. 1 is a schematic and diagrammatic view, showing a major part of an exposure system according to a first embodiment of the present invention.

Referring first to FIG. 3, which is a graph showing a distribution of synchrotron orbital radiation beam energy with respect to wavelength, the axis of the abscissa denotes the wavelengths and the axis of ordinate depicts the relative value of the energy. It is seen from FIG. 3 that in the synchrotron orbital radiation beam a light of wavelength within the visible region or a region adjacent thereto, has an energy which is about 1/100 of the maximum energy. In a first embodiment which will be described below, light in the visible region or a region adjacent thereto (within a range of about 3800-9000 angstroms), contained in the synchrotron orbital radiation beam, is used to execute the axis alignment of an exposure beam (SOR beam) and a pattern transferring exposure station of an exposure system.

FIG. 1 is a side view schematically and diagrammatically showing a major part of an exposure system according to the first embodiment of the present invention. Denoted in this Figure at 1 is a pattern transferring exposure station of an exposure system (X-ray exposure apparatus); at 2 is first driving means by which the pattern transferring exposure station 1 can be translated in X-axis and Y-axis directions as viewed in the drawing and also can be rotationally moved in each of Wx and Wy directions about the X and Y axes, respectively. Denoted at 3 is a radiation beam (exposure beam) emanating from an electron orbital device (SOR) 23 and including an X-ray beam 5; at 4 is a mirror effective to transform the radiation beam 3 into an X-ray flux 5 having surface expansion, the transformation being made by, for example, oscillating the mirror itself; at 6 and 7 are a mask (in this example, which may be a dummy mask) and a wafer, respectively, which are placed in the pattern transferring exposure station 1; and at 8 is an axis adjusting optical system.

The axis adjusting optical system 8 comprises members denoted at 9-16 supported as a unit in a predetermined relationship. The optical system 8 can be translated in X' and Y' directions and also can be rotationally moved in Wx' and Wy' directions, by second driving means 17. Denoted at 9 is an X-ray cut filter made of a non-brown glass for example, that is operable to intercept a radiation beam component in the X-ray region but to transmit only the light in the visible region or a region adjacent thereto; at 10 is a light blocking plate having an aperture of a circular shape or cross shape, for example; at 11 and 12 are first and second beam splitters; at 13 is a corner cube; at 14 is an autocollimator; at 15 is a telescope; and at 16 is a TV camera. Those elements denoted at 11, 13 and 14 cooperate to provide a first observation optical system, while those elements denoted at 12, 15 and 16 cooperate to provide a second observation optical system. With respect to the center of the aperture of the light blocking plate 10 and to the first and second beam splitters 11 and 12, the first and second observation systems have their optical axes placed in a coaxial relationship.

Denoted at 18 and 18' are signal processors, each being adapted to process a signal from the autocollimator 14 or the TV camera 16, and to transmit a resultant signal to an associated controller 19 or 19'. The controllers 19 and 19' are operable in response to the outputs from the signal processors 18 and 18', respectively, to produce control signals for actuating the first and second driving means 2 and 17. Denoted at 20 is a reference surface provided, in this example, on a reflective member, for the axis alignment purpose. For example, the reference surface comprises an optical reflection flat surface having an alignment mark of a cross shape formed at the center thereof. The reflective member 6 may have a size and a shape the same as those of a mask or a wafer used for production of microcircuits. In this illustrated example, the reflective member is disposed at the position 6 in place of such a mask.

Two coordinate systems as illustrated are determined so that the direction perpendicular to a reference plane, for setting the pattern transferring exposure station 1 of the exposure system, is depicted by Y; the direction of incidence of the X-ray flux 5 is depicted by Z; the direction parallel to the radiation beam 3 is depicted by Z' and the direction perpendicular to the radiation beam 3 is depicted by Y'.

The operation for the axis adjustment to be made in the X-ray exposure system structured as described above, will be explained below. It is to be noted here that upon the axis adjustment, a mask stage or a wafer stage, which is included in the pattern transferring exposure station 1 and to which the reflective member 6 having the axis adjusting reference surface 20 is mounted, is disposed at such position and angle which are preset as a reference for the exposure, and that the mirror 4 is of the type that the radiation beam is diverged by oscillation thereof, is fixed at such angle which is the center of its maximum oscillation range. The mask stage, to which a reflective member having a reference surface 20 for the axis adjustment may be mounted, may be made to be only rotationally movable in a Wz direction (a rotational direction about the Z axis), with a result of coincidence of the center of the mask stage and the center of the exposure area.

For this axis adjustment, first the axis of the exposure beam and the axis of the axis adjusting optical system 8 are brought into alignment by using the first observation optical system. Initially, the second driving means 17 operates to translate the axis adjusting optical system 8 in the X'-Y' plane through a predetermined distance to displace the same to a position traversing the radiation beam 3 and, thereafter, the radiation beam 3 is projected thereupon. The distance through which the axis adjusting optical system 8 is moved is set, while taking into account the retracted position of the optical system 8 itself and the position of the axis of the radiation beam 3 (having been designed), so that the center of the aperture stop of the light blocking plate 10 in the axis adjusting optical system 8 is located, after the movement of the optical system 8, just on or close to the axis of the radiation beam 3. While not shown in FIG. 1, the position of the pattern transferring exposure station 1 and the position of the axis adjusting optical system 8 are monitored by using suitable means such as a laser interferometer, for example, the results of such monitoring being fed back to the a controller.

As the radiation beam 3 is projected on the axis adjusting optical system 8, the light component of the radiation beam 3 in the X-ray wavelength region is intercepted by the X-ray cut filter 9, and only the light in the visible region or in a region close thereto, passing in close proximity to the axis OX, is allowed to pass therethrough, and is then reduced to a minute diameter by means of the aperture of the light blocking plate 10. Thereafter, it passes through the second beam splitter 12 and enters into the first beam splitter 11. A portion of the light incident on the first beam splitter 11 is deflected by a first reflection surface and impinges on the corner cube 13. According to the characteristics of the corner cube 13, the inputted light emanates from the corner cube 13 along its oncoming path. Then, the light enters the first beam splitter again, and after passing therethrough, it is received by the autocollimator 14.

Thus, as illustrated in FIG. 2, the light component in the visible region or a region adjacent thereto, contained in the radiation beam 3, appears within the view field of the autocollimator 14 in the form of a spot 21 having a shape as determined by the aperture of the light blocking plate 10. At this time, the projection of light by the autocollimator 14 itself is inhibited. Then, the second driving means 17 operates to move the axis adjusting optical system 8 so that the spot 21 comes to the center OC of the view field of the autocollimator 14 (i.e. the center of a cursor 22 or, alternatively, it may be a blade means having a minute aperture which represents the center position of the view field of the autocollimator). As is well known in the art, an autocollimator comprises a projection optical system for projecting an index, such as a cursor, upon a surface of the subject of measurement, and a re-imaging optical system for re-imaging an image projected on the subject of measurement through the projection optical system. The projection optical system and the re-imaging optical system have their optical axes placed in a coaxial relationship. Thus, the present embodiment uses such a common axis of the autocollimator as an optical axis OA of the autocollimator.

When the above coincidence is accomplished, the axis OX of the radiation beam 3 and the axis OA of the autocollimator 14 are brought into a coaxial or a substantially coaxial relationship.

More specifically, in this occasion, the signal processor 18 is used to process the information as obtained from the autocollimator to detect the position of the spot 21 upon the cursor 22 of the autocollimator. In accordance with a detected value, the controller 19 actuates the driving means 17 so that the spot position comes to the center OC.

Subsequently, the second observation optical system is used additionally, to accomplish the axis alignment between the axis adjusting optical system 8 and the pattern transferring exposure station 1. Initially, by using the telescope 15 and the TV camera 16 and through the second beam splitter 12, a mark (of a cross shape, for example) which is provided at the center of the reference surface 20 is observed. Then, by using the first driving means 2, the pattern transferring exposure station 1 is displaced in X and Y directions so that the center of the mark becomes coincident with the center of a spot on the reference surface 20, which is seen at the middle of the picture plane (the spot being provided by a portion of the radiation beam 3 in the visible region or adjacent thereto, having been transmitted through the second beam splitter 12). At this time, the mark on the reference surface is illuminated by means of an unshown illumination source. The control of the driving means 2 at this time is executed by the controller 19'.

More specifically, the signal processor 18' operates to process the information as obtained by the TV camera 16 to detect the positions of the mark and the spot on the reference surface 20, in response to which the controller 19' controls the driving means 2.

When the cursor 22 (FIG. 2) of cross shape is projected upon the reference surface 20 through a second reflection surface of the first beam splitter 11, with the illumination by the light from the autocollimator any inclination of a normal to the reference surface 20 (i.e. the axis of the pattern transferring exposure station 1) with respect to the axis of the exposure beam can be detected, on the basis of any deviation between the cursor 22 and a reflection image within the view field of the autocollimator 14 by the reference surface 20. Thus, the pattern transferring exposure station 1 is moved rotationally in the Wx and Wy directions by the first driving means 2, so as to remove the inclination.

More specifically, in this occasion, the information as obtained from the autocollimator is processed by the signal processor 18, whereby any deviation between the reflection image and the cursor 22 is detected. In response to a detected value, the controller 19 controls the driving means 2.

If, by this adjustment, the spot on the reference surface 20 shifts from the center of the mark provided on the reference surface 20, the pattern transferring exposure station 1 is displaced in the X and Y directions in the manner described hereinbefore and, similarly, the inclination of the reference surface 20 is adjusted by the rotational movement in the Wx and Wy directions.

By repeating the above-described adjustment to accomplish the axis adjustment between the pattern transferring exposure station 1 and the axis adjusting optical system 8, finally the axis OX of the exposure beam and the axis OM of the pattern transferring exposure station 1 can be aligned with each other. After the adjustment is completed, the axis adjusting optical system 8 is retracted to a position not intercepting the radiation beam 3, whereby the exposure system becomes ready for the exposure.

An X-ray beam has an angle of divergence of 1 milliradian and, therefore, a mechanical precision not greater than 0.1 milliradian may be required. However, an autocollimator can provide a precision not greater than 1 second (5 microradians), and thus is sufficient.

In the present embodiment, the axis adjusting optical system 8 is disposed between the radiation beam source 23 and the mirror 4. However, it may be disposed between the mirror 4 and the pattern transferring exposure station 1.

Light blocking plate 10 usable in the present invention will be explained in greater detail.

FIG. 4 is a top plan view of such a light blocking plate 10. As shown, it is provided with an aperture 23 whose diameter is set sufficiently small, as compared with the diameter or size of the radiation beam 3. The light blocking plate 10 can function to restrict or reduce the diameter of the radiation beam, and this provides various advantages which will be explained in conjunction with FIG. 5.

Denoted in FIG. 5 at 24 and 25 are different radiation beams projected on the light blocking plate 10 in different directions. Reference numerals 26 and 27 denote the portions of the radiation beams 24 and 25 which pass through the light blocking plate 10. Denoted at 28 is a light receiving sensor which may comprise a linear image sensor, for example. Reference numerals 29 and 30 depict the positions on the sensor 28 at which the axes 26 and 27 intersect with the sensor 28. The sensor 28 and the light blocking plate 10 are made integrally with each other.

In operation, the radiation beams 24 and 25 are restricted and reduced to sufficiently small diameters, by the light blocking plate 10, and are received by the sensor 28. The direction of projection of each radiation beam 24 or 25 upon or with respect to the light blocking plate 10 and the sensor 28 can be detected on the basis of the position of incidence thereof upon the sensor 28. If such light blocking plate 10 is not used, it is necessary to use a large sensor having a wide light receiving surface, which is larger than the cross-sectional area of the radiation beams 24 and 25, in order to detect the direction of projection of these beams. This is a disadvantage since the structure becomes bulky and expensive.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing an original having a pattern and a substrate, with synchrotron radiation, said apparatus comprising:
   means for providing the synchrotron radiation;
   an exposure unit being able to support the original and the substrate, and for exposing the original and the substrate with the synchrotron radiation to transfer the pattern of the original onto the substrate, said exposure unit having a reflective member;
   a detector for receiving any of the synchrotron radiation as reflected by said reflective member of said exposure unit, to detect the attitude of said exposure unit with respect to the synchrotron radiation; and
   means for reducing distortion related to the transfer of the pattern, on the basis of the detection by said detector.

2. An apparatus according to claim 1, further comprising a blocking member for allowing passage of a portion of the synchrotron radiation so that the portion forms a spot on said reflective member of said exposure unit.

3. An apparatus according to claim 2, further comprising a filter for extracting a predetermined wavelength component of the synchrotron radiation, wherein the extracted wavelength component is reflected by said reflective member and is received by said detector.

4. An apparatus according to claim 3, wherein said filter is disposed upstream of said blocking member with respect to the advancement direction of the synchrotron radiation.

5. An apparatus according to claim 3, wherein said blocking member and said filter are movable out of the path of the synchrotron radiation.

6. An apparatus according to claim 3, wherein said filter extracts a visible wavelength component of the synchrotron radiation.

7. An exposure apparatus for exposing an original and a substrate with synchrotron radiation, said apparatus comprising:
   means for providing the synchrotron radiation;
   an exposure unit capable of supporting the original and the substrate, for exposing the original and the substrate with the synchrotron radiation, said exposure unit including a reflective member;
   a detector for receiving any of the synchrotron radiation as reflected by said reflecting member of said exposure unit to detect the attitude of said exposure unit with respect to the synchrotron radiation; and
   an adjuster for adjusting the attitude of said exposure unit with respect to the synchrotron radiation, on the basis of the detection by said detector.

8. An apparatus according to claim 7, further comprising a blocking member for allowing passage of a portion of the synchrotron radiation so that the portion forms a spot on said reflective member of said exposure unit.

9. An apparatus according to claim 8, further comprising a filter for extracting a predetermined wavelength component of the synchrotron radiation, wherein the extracted wavelength component is reflected by said reflective member and is received by said detector.

10. An apparatus according to claim 9, wherein said blocking member and said filter are movable out of the path of the synchrotron radiation.

11. An apparatus according to claim 9, wherein said filter serves to extract a visible wavelength component of the synchrotron radiation.

12. An apparatus according to claim 9, wherein said filter is disposed upstream of said blocking member with respect to the advancement direction of the synchrotron radiation.

13. An exposure method, comprising the steps of:
    introducing synchrotron radiation into an exposure unit, the exposure unit being capable of supporting an original and a substrate therein;
    detecting any of the synchrotron radiation as reflected in the exposure unit to detect the attitude of the exposure unit with respect to the synchrotron radiation;
    adjusting the attitude of the exposure unit with respect to the synchrotron radiation, on the basis of the detection performed in said detecting step; and
    exposing the original and the substrate with synchrotron radiation by use of the attitude adjusted exposure unit.

14. A method according to claim 13, said detecting step comprises the step of detecting a predetermined wavelength component of the synchrotron radiation for the attitude detection.

15. A method according to claim 13, said introducing step comprises the step of forming a spot on a reflective member in the exposure unit by which the synchrotron radiation is reflected.

16. An exposure method for exposing an original and a substrate with synchrotron radiation, comprising the steps of:
    causing a predetermined wavelength component of the synchrotron radiation to be reflected by a reflective member disposed in an exposure unit, wherein the exposure unit is capable of supporting the original and the substrate therein;
    detecting the reflected wavelength component;
    controlling the relative attitude of the exposure unit and the synchrotron radiation on the basis of the detection in said detecting step; and supplying synchrotron radiation into the exposure unit to expose the original and the substrate placed in the exposure unit.

17. A method according to claim 16, wherein said causing step comprises the step of causing a predetermined wavelength component of the synchrotron radiation to form a spot on the reflective member, which spot has a size smaller than an illumination range to be defined by the synchrotron radiation.

18. An exposure method for transferring a pattern of a mask onto a wafer by using synchrotron radiation, said method comprising the steps of:
  projecting a predetermined wavelength component of the synchrotron radiation onto a reflective member placed in an exposure unit which is capable of supporting the mask and the wafer therein;
  detecting the wavelength component as reflected by the reflective member;
  controlling the relative attitude of the exposure unit and the synchrotron radiation on the basis of the detection in said detecting step; and
  exposing the mask and the wafer, placed in the exposure unit, with synchrotron radiation, whereby the pattern of the mask is transferred to the wafer.

19. A method according to claim 18, further comprising the step of placing the mask at the position of the reflective member in place thereof, after said detecting step.

20. A semiconductor device manufacturing method using synchrotron radiation, comprising the steps of:
  causing a predetermined wavelength component of synchrotron radiation to be reflected by a reflective member of an exposure unit which is capable of supporting a mask and a wafer therein;
  detecting the wavelength component reflected by the reflective member;
  adjusting the attitude of the exposure unit with respect to the synchrotron radiation; and
  exposing the mask and the wafer in the exposure unit, with synchrotron radiation, whereby a pattern of the mask is transferred to the wafer.

21. A method according to claim 20, wherein said causing step comprises the step of causing a predetermined wavelength component of synchrotron radiation to form a spot on the reflective member, which spot has a size smaller than an illumination range to be defined by the synchrotron radiation.

22. A method according to claim 20, wherein said causing step comprises the step of extracting the predetermined wavelength component of the synchrotron radiation using a filter.

23. A method according to claim 22, wherein said extracting step comprises the step of extracting a visible wavelength component of the synchrotron radiation using the filter.

24. An exposure apparatus, comprising:
  a radiation source for providing synchrotron radiation;
  an exposure unit for exposing an original and a substrate with the synchrotron radiation, said exposure unit being capable of supporting the original and the substrate therein;
  a reflection mirror for directing the synchrotron radiation from said radiation source to said exposure unit along a predetermined direction of projection;
  an alignment unit for extracting a predetermined wavelength component of light out of the synchrotron radiation and providing an alignment beam to be guided to said exposure unit;
  a detector for detecting the alignment beam reflected by a reflective member provided in said exposure unit; and
  control means for controlling the relative inclination between said exposure unit and said predetermined direction, on the basis of an output of said detector.

25. An apparatus according to claim 24, wherein said detector is provided in said alignment unit.

26. An exposure apparatus for exposing an original and a substrate with synchrotron radiation, comprising:
  means for providing the synchrotron radiation;
  an exposure unit for exposing the original and the substrate with the synchrotron radiation, said exposure unit being capable of supporting the original and the substrate therein;
  a reflection mirror for directing the synchrotron radiation to said exposure unit along a predetermined direction of projection;
  a detector for detecting an alignment beam as reflected by a reflective member provided in said exposure unit, wherein the alignment beam comprises a predetermined wavelength component of the synchrotron radiation and is directed to said exposure unit along said predetermined direction; and
  means for correcting any relative inclination error between said exposure unit and said predetermined direction, on the basis of an output of said detector.

27. An exposure method for exposing an original and a substrate with synchrotron radiation, said method comprising the steps of:
  directing, by using a reflection mirror, the synchrotron radiation to an exposure unit along a predetermined direction of projection, wherein the exposure unit is capable of supporting the original and the substrate therein;
  detecting an alignment beam with a detector, wherein the alignment beam comprises a predetermined wavelength component of the synchrotron radiation as reflected by a reflective member provided in the exposure unit, and directed to the exposure unit along the predetermined direction;
  correcting any error in the relative attitude between the exposure unit and the predetermined direction, as defined by the reflective member, on the basis of an output of the detector; and
  exposing the original and the substrate supported in the exposure unit with the synchrotron radiation from the reflective member.

28. A method according to claim 27, further comprising the step of exposing the substrate with synchrotron radiation passing through a mask.

29. A method according to claim 28, further comprising the step of holding the reflective member and the mask at the same site in the exposure unit.

30. A method of manufacturing semiconductor devices by using synchrotron radiation, said method comprising the steps of:
  directing, by using a reflection mirror, the synchrotron radiation to an exposure unit along a predetermined direction of projection, wherein the exposure unit is capable of supporting a mask and a wafer therein;
  detecting an alignment beam with a detector, wherein the alignment beam comprises a predetermined wavelength component of the synchrotron radiation as reflected by a reflective member, provided in the exposure unit, and directed to the exposure unit along the predetermined direction;

correcting any error in the relative attitude between the exposure unit and the predetermined direction, as defined by the reflective member, on the basis of an output of the detector; and exposing the mask and the wafer, supported in the exposure unit, with the synchrotron radiation from the reflective member, to print a pattern of the mask on the wafer.

* * * * *

UNITED STATES PATENT AND TRADEMARK OFFICE
CERTIFICATE OF CORRECTION

PATENT NO. : 5,276,725
DATED : January 4, 1994
INVENTOR(S) : EIGO KAWAKAMI, et al.

It is certified that error appears in the above-indentified patent and that said Letters Patent is hereby corrected as shown below:

ON THE TITLE PAGE
    AT [56] Other Publications
    "x-ray" (both occurrences) should read --X-ray--.

COLUMN 4
    line 36, "thereof" should read --thereof, and--; and
    line 65, "the" should be deleted.

COLUMN 6
    line 9, "autocollimator" should read --autocollimator 14,--; and
    line 46, "thus" should read --thus,--.

COLUMN 8
    line 48, "said" should read --wherein said--; and
    line 52, "said" should read --wherein said--.

Signed and Sealed this

Twelfth Day of July, 1994

Attest:

BRUCE LEHMAN

Attesting Officer       Commissioner of Patents and Trademarks